(12) United States Patent
Kang

(10) Patent No.: US 10,994,242 B2
(45) Date of Patent: May 4, 2021

(54) INKJET PRINTING APPARATUS

(71) Applicant: Samsung Display Co., Ltd., Yongin-Si (KR)

(72) Inventor: Yoonho Kang, Gyeonggi-do (KR)

(73) Assignee: Samsung Display Co., Ltd.

( * ) Notice: Subject to any disclaimer, the term of this patent is extended or adjusted under 35 U.S.C. 154(b) by 36 days.

(21) Appl. No.: 16/459,241

(22) Filed: Jul. 1, 2019

(65) Prior Publication Data

US 2020/0101414 A1    Apr. 2, 2020

(30) Foreign Application Priority Data

Oct. 2, 2018   (KR) .................. 10-2018-0117313

(51) Int. Cl.
| | | |
|---|---|---|
| *B41J 2/175* | (2006.01) | |
| *B41J 2/165* | (2006.01) | |
| *B01D 53/10* | (2006.01) | |
| *H01L 51/00* | (2006.01) | |
| *H01L 51/56* | (2006.01) | |

(52) U.S. Cl.
CPC .......... *B01D 53/10* (2013.01); *B41J 2/16535* (2013.01); *B41J 2/17566* (2013.01); *B41J 2/17596* (2013.01); *H01L 51/0005* (2013.01); *H01L 51/56* (2013.01); *B01D 2253/108* (2013.01)

(58) Field of Classification Search
CPC . B41J 2/17596; B41J 2/17566; B41J 2/16535

USPC ................... 347/84, 85, 93, 95, 97, 100
See application file for complete search history.

(56) References Cited

U.S. PATENT DOCUMENTS

| | | |
|---|---|---|
| 5,340,388 A | 8/1994 | Breton et al. |
| 6,730,357 B2 | 5/2004 | Kawase |
| 8,119,188 B2* | 2/2012 | Kuwabara ........... H01L 51/0003 427/66 |
| 9,045,822 B2* | 6/2015 | Kang ..................... C23C 14/58 |
| 9,421,780 B2* | 8/2016 | Nishiyama ........... B41J 2/17596 |
| 10,005,307 B2 | 6/2018 | Langos et al. |
| 10,442,187 B2* | 10/2019 | Matsuoka ............ B41J 2/17563 |
| 2005/0124979 A1 | 6/2005 | Santini, Jr. et al. |
| 2013/0004656 A1 | 1/2013 | Chen et al. |
| 2017/0136773 A1 | 5/2017 | Mauck et al. |

FOREIGN PATENT DOCUMENTS

| | | |
|---|---|---|
| EP | 1883124 A1 | 1/2008 |
| GB | 2360489 A | 9/2001 |
| JP | 4027665 B2 | 12/2007 |
| KR | 10-1864055 B1 | 6/2018 |

* cited by examiner

*Primary Examiner* — An H Do
(74) *Attorney, Agent, or Firm* — Innovation Counsel LLP

(57) ABSTRACT

An inkjet printing apparatus includes a first stage on which a substrate is disposed, an ink storage portion including ink and a plurality of pollutant adsorption balls dispersed in the ink, a head portion including a nozzle configured to eject the ink supplied from the ink storage portion to the substrate, and a gas discharging portion disposed on a side of the ink storage portion.

19 Claims, 6 Drawing Sheets

INKJET PRINTING APPARATUS

CROSS-REFERENCE TO RELATED APPLICATIONS

This U.S. non-provisional patent application claims priority under 35 U.S.C. § 119 to Korean Patent Application No. 10-2018-0117313, filed on Oct. 2, 2018, the disclosure of which is hereby incorporated by reference in its entirety.

BACKGROUND

The present disclosure relates to an inkjet printing apparatus, and more particularly, to an inkjet printing apparatus capable of reducing a defect rate of an organic light emitting layer in a display apparatus.

Recently, an organic light emitting diode (OLED) display apparatus has been spotlighted as a next generation flat display apparatus for its excellent luminance characteristics and viewing angle characteristics without requiring an additional light source unlike a liquid crystal display apparatus. Since no additional light source is required, the OLED display apparatus may be manufactured to have a light weight and a thin-type. In addition, the OLED display apparatus has a low power consumption, a high luminance, and a high reaction speed.

The OLED display apparatus includes a plurality of light emitting elements each including an anode, an organic light emitting layer, and a cathode. A hole and an electron are injected from the anode and the cathode into the organic light emitting layer to form an exciton. While the exciton is transferred to a ground state, the light emitting element emits light.

When the light emitting element is manufactured, the organic light emitting layer may be manufactured by using an inkjet printing apparatus. The organic light emitting layer may be formed by ejecting an organic material (or ink) from the inkjet printing apparatus onto a substrate for forming the organic light emitting layer.

The ink stored in the inkjet printing apparatus may contain impurities, and an amount of the impurities may increase due to various factors such as time elapses. Since purity of the organic light emitting layer decreases as the amount of the impurities increases, a defected organic light emitting layer may be manufactured.

SUMMARY

The present disclosure provides an inkjet printing apparatus capable of reducing a defect rate of an organic light emitting layer in a display apparatus.

An embodiment of the inventive concept provides an inkjet printing apparatus including: a first stage on which a substrate is disposed; an ink storage portion including an ink and a plurality of pollutant adsorption balls dispersed in the ink; a head portion including a nozzle configured to eject the ink supplied from the ink storage portion to the substrate; and a gas discharging portion disposed on a side of the ink storage portion.

Each of the plurality of pollutant adsorption balls may include a zeolite.

The plurality of pollutant adsorption balls may include a plurality of first pollutant adsorption balls including pores having a diameter of about 3 Å to about 4 Å, a plurality of second pollutant adsorption balls including pores having a diameter of about 5 Å, and a plurality of third pollutant adsorption balls including pores having a diameter of about 8 Å to about 10 Å.

The ink may be supplied to the head portion through a plurality of first openings defined in a lower portion of the ink storage portion.

Each of the plurality of pollutant adsorption balls may have a diameter greater than that of each of the plurality of first openings.

An upper portion of the head portion may include a plurality of second openings overlapping the first openings, and the ink stored in the ink storage portion may be supplied to the head portion through the first and second openings.

The ink supplied to the head portion through the first and second openings may be stored in a storage space in the head portion and ejected through the nozzle.

The inkjet printing apparatus may further include: a sensor part configured to measure a height of the ink stored in the ink storage portion, a first valve connected to the ink storage portion and configured to supply the ink to the ink storage portion according to the height of the ink, and a second valve connected to the ink storage portion and configured to provide a negative pressure to the ink storage portion.

When the height of the ink is lower than a first height, the first valve is opened, and the ink may be supplied to the ink storage portion, and when the height of the ink is a second height that is greater than the first height, the first valve may be closed.

The second valve may be opened to stop the ejection of the ink, and the negative pressure may be provided to the ink storage portion through the second valve.

The inkjet printing apparatus may further include: an ink purging portion that is spaced apart from the first stage, and when the head portion is placed on the ink purging portion, the ink purging portion may remove a predetermined amount of ink ejected from the nozzle.

When the head portion is placed on the ink purging portion, the gas discharging portion may discharge a gas in a downward direction toward the ink purging portion.

The ink purging portion may include: a bottom part in which a discharge hole is defined, and a partition wall part extending upward from an edge of the bottom part.

When viewed from a plane, the ink storage portion, the head portion, and the gas discharging portion may overlap the bottom part, and the nozzle may be placed in a space defined by the bottom part and the partition wall part when the head portion is placed on the ink purging portion.

The bottom part may include: an inclined surface connected to an end of the discharge hole and a horizontal surface disposed between the inclined surface and the edge of the bottom part. The inclined surface may have a height that gradually increases from the discharge hole to the horizontal surface.

The inkjet printing apparatus may further include: a first discharge pipe connected to the discharge hole to discharge the predetermined amount of ink, and a second discharge pipe connected to the discharge hole to discharge ink mist generated from the predetermined amount of ink.

The second discharge pipe may be disposed higher than the first discharge pipe.

The inkjet printing apparatus may further include a nozzle wiping portion spaced apart from the ink purging portion to wipe a bottom surface of the nozzle.

The nozzle wiping portion may include: a first roller, a second roller spaced apart from the first roller, and a clean sheet wound around the first and second rollers to move from the first roller to the second roller according to rotation of the first and second rollers. The bottom surface of the nozzle may contact the clean sheet.

In another embodiment of the inventive concept, an inkjet printing apparatus includes: a first stage on which a substrate is disposed; an ink storage portion including an ink and a plurality of pollutant adsorption balls configured to adsorb pollutant particles dispersed in the ink; a head portion including a nozzle configured to eject the ink supplied from the ink storage portion to the substrate; an ink purging portion spaced apart from the first stage; and a gas discharging portion configured to discharge a gas. Here, when the head portion is placed on the ink purging portion, the gas discharging portion discharges a gas toward the ink purging portion, and the ink purging portion removes a predetermined amount of ink discharged from the nozzle.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
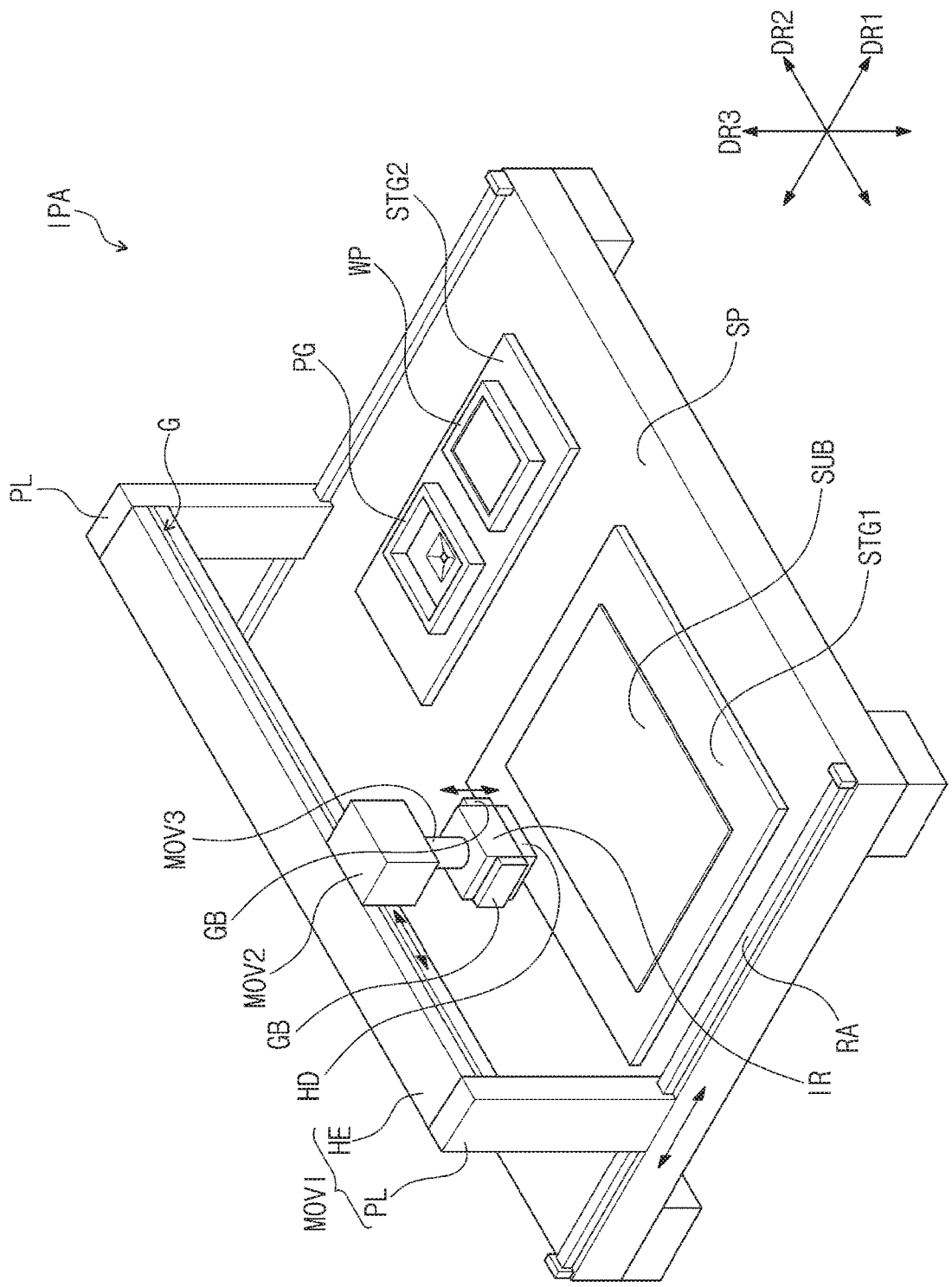
FIG. 1 is a view illustrating an inkjet printing apparatus according to an embodiment of the inventive concept.

It will be understood that when an element such as a region, layer, or portion is referred to as being "on" another element, it can be directly on the other element or one or more intervening elements may also be present.

Like reference numerals refer to like elements throughout. In addition, in the drawings, thicknesses, ratios, and dimensions of components are exaggerated for clarity of illustration.

As used herein, the term "and/or" includes any and all combinations of one or more of the associated listed items.

It will be understood that although the terms of "first" and "second" are used herein to describe various elements, these elements should not be limited by these terms. The terms are only used to distinguish one component from other components. For example, an element referred to as a first element in one embodiment can be referred to as a second element in another embodiment. The terms of a singular form may include a plural form unless explicitly referred to the contrary.

In addition, spatially relative terms, such as "below," "lower," "above," and "upper" may be used herein for ease of description to describe an element and/or a feature's relationship to another element(s) and/or feature(s) as illustrated in the drawings. The terms are relative concepts and described with respect to the direction indicated in the drawings. Depending on a view or orientation of the drawings, those spatially relative terms may be used differently. For example, an element that is described as being disposed "on" a layer in a drawing may be disposed "below" the layer when the orientation of the drawing is flipped upside down.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined explicitly in the description, the terms are not ideally or excessively construed as having a specifically formal meaning.

The meaning of the term of "include" or "comprise" specifies an inclusion of a property, a region, a fixed number, a step, a process, an element, and/or a component but does not exclude other properties, regions, fixed numbers, steps, processes, elements and/or components.

Hereinafter, exemplary embodiments of the inventive concept will be described in detail with reference to the accompanying drawings.

FIG. 1 is a view illustrating an inkjet printing apparatus according to an embodiment of the inventive concept.

Referring to FIG. 1, an inkjet printing apparatus IPA according to an embodiment of the inventive concept may include a support plate SP, first and second stages STG1 and STG2, a first moving portion MOV1, a second moving portion MOV2, a third moving portion MOV3, an ink storage portion IR, a head portion HD, an ink purging portion PG, and a nozzle wiping portion WP.

The first and second stages STG1 and STG2, the first moving portion MOV1, the second moving portion MOV2, the third moving portion MOV3, the ink storage portion IR, the head portion HD, the ink purging portion PG, and the nozzle wiping portion WP may be disposed on the support plate SP. The support plate SP may have a plane extending in a first direction DR1 and a second direction DR2 that crosses the first direction DR1.

The first moving portion MOV1 may linearly and controllably move in the first direction DR1, and the second moving portion MOV2 may linearly and controllably move in the second direction DR2. The third moving portion MOV3 may linearly and controllably move in a third direction DR3 that is perpendicular to the plane defined by the first and second directions DR1 and DR2.

The first moving portion MOV1 may include a plurality of pillars PL extending in the third direction DR3 and a horizontal extension part HE extending in the second direction DR2. In one embodiment, each of the pillars PL and the horizontal extension part HE may have an elongated shape with various cross-sectional shapes (e.g., a beam with an I-shaped cross-section with a groove G), however the inventive concept is not limited thereto, and each of the pillars PL and the horizontal extension part HE may have various other elongational and cross-sectional shapes.

The pillars PL may be disposed on both sides of the support plate SP that are opposite to each other in the second direction DR2. The horizontal extension part HE may be disposed between the pillars PL to connect upper portions of the pillars PL to each other. Although two pillars PL are exemplarily shown to be disposed on the both sides of the support plate SP, the embodiment of the inventive concept is not limited to two, and any number of pillars PL may be used without deviating from the scope of the present disclosure.

The pillars PL may synchronously and controllably move along a top surface of the support plate SP in the first direction DR1. For example, rails RA extending in the first direction DR1 may be disposed respectively on the both sides of the support plate SP, and each of the pillars PL may be coupled to the corresponding rail RA. The pillars PL may synchronously and controllably move along the rails RA in the first direction DR1.

The second moving portion MOV2 may be coupled to the horizontal extension part HE. For example, the second moving portion MOV2 may be coupled to one side surface of both side surfaces of the horizontal extension part HE that are opposite to each other in the first direction DR1. The second moving portion MOV2 may controllably move along the horizontal extension part HE in the second direction DR2. In one embodiment, the second moving portion MOV2 may be coupled to a groove G that extends in the second direction DR2 and is defined in the side surface of the horizontal extension part HE to which the second moving portion MOV2 is coupled, and controllably move along the groove G in the second direction DR2.

The third moving portion MOV3 may be coupled to the second moving portion MOV2 and controllably move in the third direction DR3 with respect to the second mobbing portion MOV2. Although the third moving portion MOV3 is shown to have a cylindrical shape, the embodiment of the inventive concept is not limited thereto, and third moving portion MOV3 may have various other shapes.

The ink storage portion IR may be disposed below and coupled to the third moving portion MOV3, and the head portion HD may be disposed below and coupled to the ink storage portion IR. A plurality of gas discharging portions GB may be disposed on and coupled to both side surfaces of the ink storage portion IR that are opposite to each other in the second direction DR2.

Although two gas discharging portions GB are exemplarily shown to be disposed on the both side surfaces of the ink storage portion IR, the embodiment of the inventive concept is not limited thereto, and the gas discharging portions GB may be used in various other configurations and numbers without deviating from the scope of the present disclosure. Alternatively, the gas discharging portions GB may be disposed on both side surfaces of the head portion HD, instead of the sides of the ink storage portion IR.

The ink storage portion IR may be coupled to a lower portion of the third moving portion MOV3, and the first, second, and third moving portions MOV1, MOV2, and MOV3 may controllably move in the first, second, and third directions DR1, DR2, and DR3, respectively. Accordingly, the ink storage portion IR, the head portion HD, and the gas discharging portions GB may controllably move according to the movements of the first, second, and third moving portions MOV1, MOV2, and MOV3 in the first, second, and third directions DR1, DR2, and DR3.

The ink storage portion IR may store ink. The ink may contain an organic material for forming an organic light emitting layer and may further contain impurities. The impurities may include various pollutants (hereinafter, referred to as "pollutant particles") such as moisture, a low molecular gas, or a polymer material except for the organic material for forming the organic light emitting layer.

The ink stored in the ink storage portion IR may be supplied to the head portion HD. The head portion HD may eject the received ink. The gas discharging portions GB may discharge a gas in a downward direction. Hereinafter, a specific feature of the gas discharging portions GB will be described in detail.

The first stage STG1 and the second stage STG2 may be spaced apart from each other. Each of the first and second stages STG1 and STG2 may have a plane defined by the first and second directions DR1 and DR2. A substrate SUB may be disposed on the first stage STG1.

The head portion HD may move along the movements of the first, second, or third moving portion MOV1, MOV2, or MOV3 in the first, second, or third direction DR1, DR2, or DR3. The head portion HD may eject the ink to the substrate SUB when it is controllably placed on the substrate SUB.

Although not shown, a camera may be disposed in the head portion HD, and the head portion HD may be aligned at a predetermined position of the substrate SUB based on an image provided by the camera. For example, the substrate SUB may include an alignment mark, and the head portion HD may be aligned at the predetermined position of the substrate SUB according to the alignment mark based on an image of the alignment mark that the camera provides. The alignment mark may be disposed at a position corresponding to that of the head portion HD for ejecting the ink. The head portion HD may eject the ink using a nozzle.

The ink purging portion PG and the nozzle wiping portion WP may be disposed on the second stage STG2. The ink purging portion PG and the nozzle wiping portion WP may be spaced apart from each other in the first direction DR1 although the relative placements of the ink purging portion PG and the nozzle wiping portion WP are not limited thereto. The ink purging portion PG is used to initiate a state of the nozzle of the head portion HD, and the nozzle wiping portion WP is used to clean a bottom surface of the nozzle of the head portion HD. Hereinafter, the specifics of the ink purging portion PG and the nozzle wiping portion WP will be described in detail.

Figure 2:
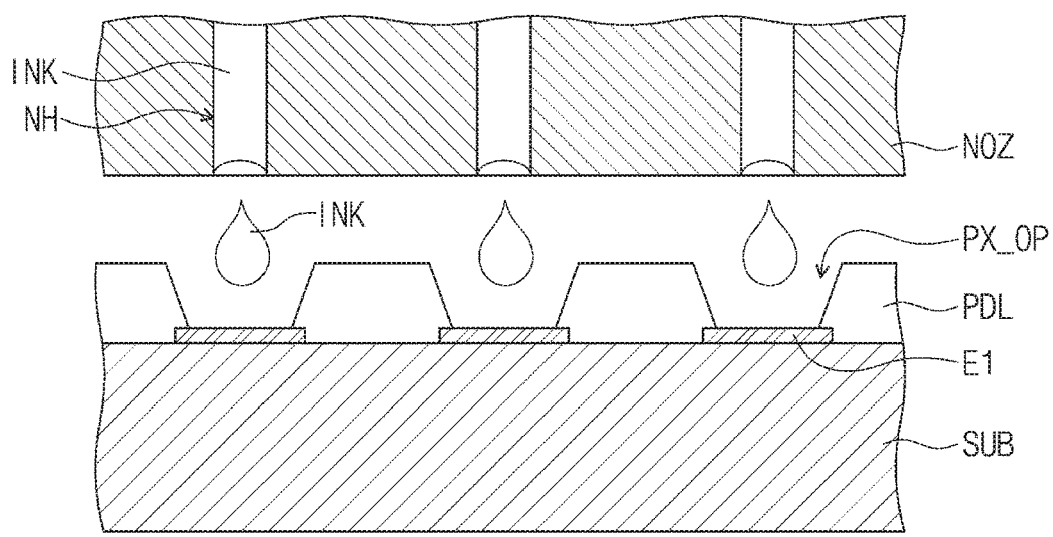
FIG. 2 is a view illustrating a method for forming an organic light emitting layer by using an inkjet printing apparatus shown in FIG. 1.
Figure 3:
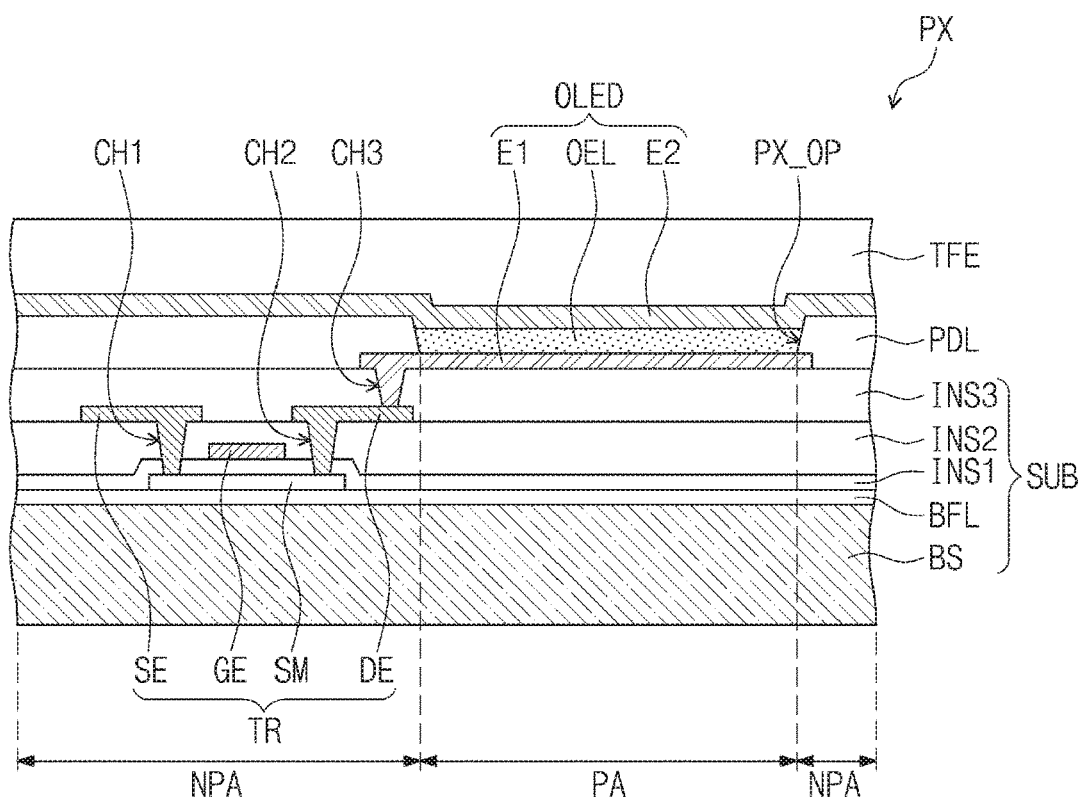
FIG. 3 is a view exemplarily illustrating a cross-section of a pixel including the organic light emitting layer that is shown in FIG. 2.

FIG. 2 is a view illustrating a method for forming an organic light emitting layer by using the inkjet printing apparatus IPA shown in FIG. 1. FIG. 3 is a view exemplarily illustrating a cross-section of a pixel including the organic light emitting layer that is shown in FIG. 2.

For convenience of description, a cross-section of a portion of a nozzle NOZ in which three nozzle holes NH are defined is exemplarily illustrated in FIG. 2. However, it is noted that the inkjet printing apparatus may have any number of nozzle holes NH without deviating from the scope of the present disclosure.

Referring to FIGS. 2 and 3, a pixel PX may include a transistor TR and a light emitting element OLED connected to the transistor TR. The light emitting element OLED may include a first electrode E1, an organic light emitting layer OEL, and a second electrode E2. The inkjet printing apparatus IPA may be used to form the organic light emitting layer OEL of the light emitting element OLED. A simplified structure of the pixel PX will be described as below.

The substrate SUB may include a base substrate BS, the transistor TR disposed on the base substrate BS, and a plurality of insulation layers including a buffer layer BFL and first, second, and third insulation layers INS1, INS2, and INS3 that are disposed together with the transistor TR. The buffer layer BFL may be disposed on the base substrate SUB, and the buffer layer BFL may contain an inorganic material. In some embodiments, the buffer layer BFL may be omitted.

A semiconductor layer SM of the transistor TR may be disposed on the buffer layer BFL. The semiconductor layer SM may include a semiconductor made of an inorganic material such as amorphous silicon or poly-silicon and an organic semiconductor. In addition, the semiconductor layer SM may include an oxide semiconductor. Although not shown in FIG. 3, the semiconductor layer SM may include a source region, a drain region, and a channel region that is disposed between the source region and the drain region.

The first insulation layer INS1 may be disposed on the buffer layer BFL and may cover the semiconductor layer SM. The first insulation layer INS1 may include an inorganic material. A gate electrode GE of the transistor TR that overlaps the semiconductor layer SM may be disposed on the first insulation layer INS1. The gate electrode GE may be disposed to overlap the channel region of the semiconductor layer SM.

The second insulation layer INS2 may be disposed on the first insulation layer INS1 and may cover the gate electrode GE. The second insulation layer INS2 may be defined as an interlayer insulation layer. The second insulation layer INS2 may contain an organic material and/or an inorganic material.

A source electrode SE and a drain electrode DE of the transistor TR may be disposed to be spaced apart from each other on the second insulation layer INS2. The source electrode SE may be connected to the source region of the semiconductor layer SM through a first contact hole CH1 that passes through the first and second insulation layers INS1 and INS2. The drain electrode DE may be connected to the drain region of the semiconductor layer SM through a second contact hole CH2 that passes through the first and second insulation layers INS1 and INS2.

The third insulation layer INS3 may be disposed on the second insulation layer INS2 and may cover the source electrode SE and the drain electrode DE of the transistor TR. The third insulation layer INS3 may be defined as a flattening layer or a planarizing layer for providing a flat (or planar) top surface, and may contain an organic material.

The first electrode E1 may be disposed on the third insulation layer INS3. The first electrode E1 may be connected to the drain electrode DE of the transistor TR through a third contact hole CH3 that passes through the third insulation layer INS3. The first electrode E1 may correspond to a pixel electrode or an anode electrode of the light emitting element OLED. In one embodiment, the first electrode E1 may be a positive electrode or a hole injection electrode.

A pixel defining layer PDL for exposing a portion of the first electrode E1 may be disposed on the first electrode E1 and the third insulation layer INS3. A pixel opening PX_OP for exposing at least a portion of the first electrode E1 may be defined in the pixel defining layer PDL. An area in which the opening PX_OP is defined may be referring to as a pixel area PA. A peripheral area of the pixel area PA may be referred to as a non-pixel area NPA.

The organic light emitting layer OEL may be disposed on the first electrode E1 in the pixel opening PX_OP. The organic light emitting layer OEL may include an organic material capable of generating light having one of red, green, and blue colors. For example, the organic light emitting layer OEL may generate white light through a combination of organic materials each generating a red, green, or blue color.

The second electrode E2 may be disposed on the pixel defining layer PDL and the organic light emitting layer OEL. The second electrode E2 may correspond to a common electrode or a cathode electrode of the light emitting element OLED. In one embodiment, the second electrode EL2 may be a negative electrode or an electron injection electrode.

A thin-film encapsulation layer TFE may be disposed on the light emitting element OLED. The thin-film encapsulation layer TFE may prevent a defect of the light emitting element OLED that may be caused by external moisture.

When a first voltage may be applied to the first electrode E1 through the transistor TR, and a second voltage having a polarity opposite to that of the first voltage may be applied to the second electrode E2, the organic light emitting layer OEL may emit light. In this case, a hole and an electron that are injected into the organic light emitting layer OEL may be coupled to each other to form an exciton, and, while the exciton is transferred to a ground state, the light emitting element OLED may emit light.

The substrate SUB for forming the organic light emitting layer OEL may be prepared, and the pixel defining layer PDL may be provided on the substrate SUB. The nozzle NOZ of the head portion HD may include the plurality of nozzle holes NH, and the ink INK may be ejected through the nozzle holes NH. The ink INK ejected from the nozzle NOZ may be provided to the pixel openings PX_OP to form the organic light emitting layers OEL in the pixel openings PX_OP.

Figure 4:
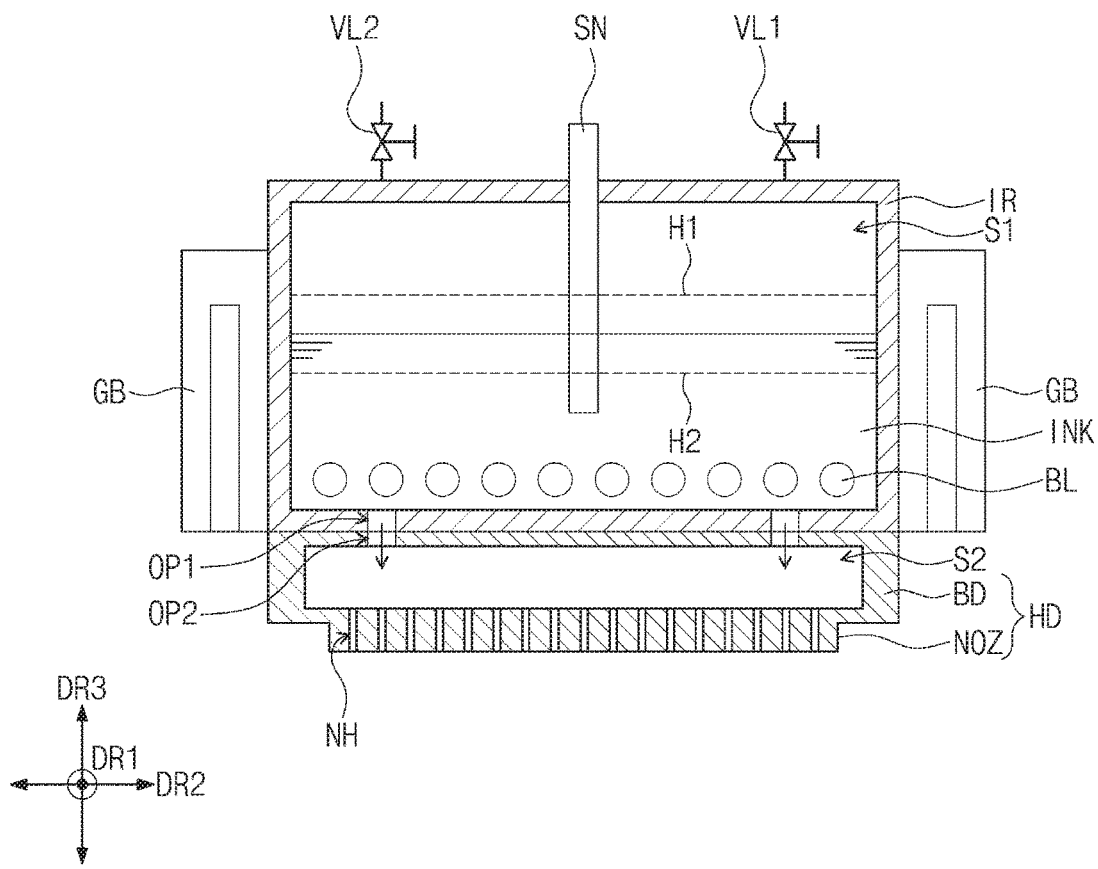
FIG. 4 is a view exemplarily illustrating cross-sections of an ink storage portion, a head portion, and gas discharging portions shown in FIG. 1.

FIG. 4 is a view exemplarily illustrating cross-sections of the ink storage portion IR, the head portion HD, and the gas discharging portions GB shown in FIG. 1. For example, the cross-section in FIG. 4 may be viewed from a position along a line extending the first direction DR1.

According to one embodiment, the ink storage portion IR may include the ink INK and a plurality of pollutant adsorption balls BL that may be dispersed in the ink INK. As described above, the ink INK may contain an organic material for forming the organic light emitting layer OEL.

The pollutant adsorption balls BL may adsorb pollutant particles of the ink INK to separate the pollutant particles from the ink INK. Accordingly, purity of the ink INK may improve by the pollutant adsorption balls BL. As the purity of the ink INK ejected by the head portion HD increases, a defect of the organic light emitting layer OEL that may be caused due to the pollutant particles may decrease.

According to one embodiment, each of the pollutant adsorption balls BL may include a zeolite. The zeolite includes a plurality of pores, and the pollutant particles may be adsorbed to the zeolite through the pores so that the pollutant particles may be separated from the ink INK.

According to one embodiment, the pollutant adsorption balls BL may include a plurality of first, second, and third pollutant adsorption balls BL that are distinguished by a size of each of the pores defined therein. Pores each having a diameter of about 3 Å to about 4 Å may be classified as the first pollutant adsorption balls BL, and the first pollutant adsorption balls BL may adsorb and remove moisture and a low molecular gas ($NH_3$, $SO_2$, and $O_3$).

Pores each having a diameter of about 5 Å may be classified as the second pollutant adsorption balls BL, and the second pollutant adsorption balls BL may adsorb and remove moisture and a low molecular gas ($C_4H_9OH$ and $C_4H_9SH$). Pores each having a diameter of about 8 Å to about 10 Å may be classified as the third pollutant adsorption balls BL, and the third pollutant adsorption balls BL may adsorb and remove a polymer material such as Di-n-butylamine.

A first storage space S1 may be defined in the ink storage portion IR, and the ink INK may be accommodated in the first storage space S1. A plurality of first openings OP1 may be defined in a lower portion of the ink storage portion IR. Although only two first openings OP1 are exemplarily illustrated, the embodiment of the inventive concept is not limited to the number of the first openings OP1, and any number of first openings OP1 may be used without deviating from the scope of the present disclosure.

Each of the pollutant adsorption balls BL may have a diameter greater than that of each of the first openings OP1. Accordingly, the pollutant adsorption balls BL may not escape to the outside of the ink storage portion IR through the first openings OP1 and may remain in the ink storage portion IR.

According to one embodiment, the inkjet printing apparatus IPA may include a sensor SN and first and second valves VL1 and VL2 that are provided to the ink storage portion IR. The sensor SN may extend in the third direction DR3 and may be connected to an upper portion of the ink storage portion IR. More specifically, the sensor SN may be disposed in the first storage space S1 while passing through the upper portion of the ink storage portion IR. A lower portion of the sensor SN may be sunken into the ink INK. In one embodiment, the sensor SN may measure a height of the ink INK.

The first valve VL1 may be connected to the ink storage portion IR and an external ink supply (not shown). The first valve VL1 may be connected to the upper portion of the ink storage portion IR. The ink INK may be supplied from the external ink supply to the ink storage portion IR through the first valve VL1.

As the first valve VL1 is opened and closed according to the height of the ink INK, the ink INK may be supplied to the ink storage portion IR. For example, when the height of the ink INK that is measured by the sensor SN is lower than a second height H2, the first valve VL1 is opened to supply the ink INK to the ink storage portion IR. When the height of the ink INK is a first height H1 that is greater than the second height H2, the first valve VL1 is closed to stop supplying the ink INK.

The second valve VL2 may be connected to the upper portion of the ink storage portion IR as being spaced apart from the first valve VL1. The second valve VL1 may provide a negative pressure to the ink storage portion IR. The negative pressure may prevent discharging of contents from the inside of the ink storage portion IR to the outside of the ink storage portion IR. When the second valve VL2 is opened, the negative pressure may be provided to the ink storage portion IR.

When the ejection of the ink INK from the head portion HD is required to be stopped, the second valve VL2 may be opened to provide the negative pressure to the ink storage portion IR to prevent the ink INK from being further discharged through the first openings OP1. The negative pressure may pull the ink INK upward so that the height of the ink INK is not further lowered. The ink INK may not be ejected from the head portion HD by the negative pressure, and the height of the ink INK stored in the ink storage portion IR may be maintained. When the ink INK is ejected from the head portion HD, the second valve VL2 may be closed.

The head portion HD may be connected to a lower portion of the ink storage portion IR. A plurality of second openings OP2 may be defined in an upper portion of the head portion HD, and the second openings OP2 may overlap the first openings OP1 of the ink storage portion IR. Although two second openings OP2 are exemplarily illustrated, the embodiment of the inventive concept is not limited to the number of the second openings OP2, and any number of second openings OP2 may be used without deviating from the scope of the present disclosure. The ink INK stored in the ink storage portion IR may be supplied to a second storage space S2 defined in the head portion HD through the first and second openings OP1 and OP2, and ejected through the head portion HD.

The head portion HD may include a body part BD and the nozzle NOZ extending downwardly from a lower portion of the body part BD. The second openings OP2 and the second storage space S2 may be defined in the body part BD. The ink INK stored in the body part BD may be ejected through the nozzle NOZ.

The plurality of nozzle holes NH extending in the third direction DR3 may be defined in the nozzle NOZ. The nozzle holes NH may be connected to the second storage space S2. The ink INK stored in the second storage space S2 may be ejected through the nozzle holes NH.

The gas discharging portions GB may be connected to both side surfaces of the ink storage portion IR, respectively. The gas discharging portions GB may discharge a gas in a downward direction. For example, the gas may include a nitrogen gas.

Figure 5:
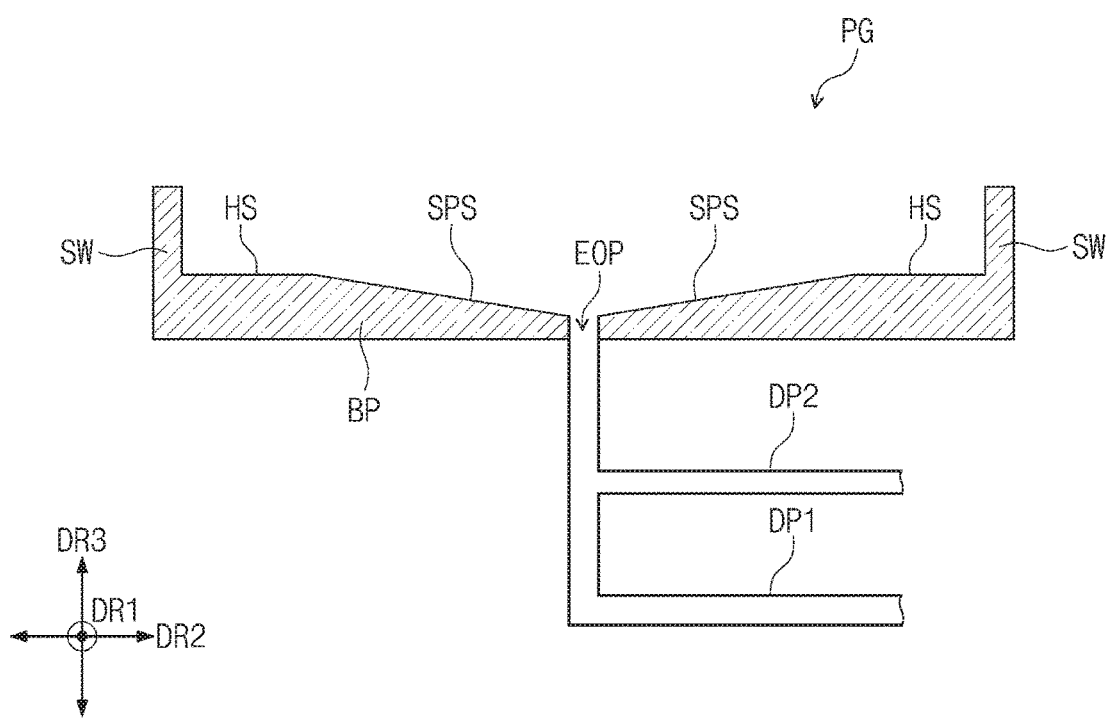
FIG. 5 is a view exemplarily illustrating a cross-section of an ink purging portion shown in FIG. 1.

FIG. 5 is a view exemplarily illustrating a cross-section of the ink purging portion PG shown in FIG. 1. For example, the cross-section in FIG. 5 may be viewed from a position along a line extending in the first direction DR1.

Referring to FIG. 5, the ink purging portion PG may include a bottom part BP in which a discharge hole EOP is defined and a partition wall part SW extending upwardly from an edge of the bottom part BP. Although the discharge hole EOP is exemplarily defined in a central portion of the bottom part BP, the embodiment of the inventive concept is not limited thereto, and the position of the discharge hole EOP may be varied without deviating from the scope of the present disclosure.

The bottom part BP may include an inclined surface SPS that is connected to an end of the discharge hole EOP is defined and a horizontal surface HS disposed between the inclined surface SPS and an edge of the bottom part BP. The discharged hole EOP may be disposed at an end of the inclined surface SPS. The inclined surface SPS may have a height that gradually increases from the discharged hole EOP in a direction toward the horizontal surface HS.

The discharge hole EOP may be connected to a first discharge pipe DP1 and a second discharge pipe DP2. The second discharge pipe DP2 is disposed higher than the first discharge pipe DP1 in the third direction DR3. Although not shown, the first and second pipes DP1 and DP2 may be connected to valves for providing a suction force to the first and second pipes DP1 and DP2, respectively.

FIGS. 6 to 9 are views for explaining an operation of the ink purging portion PG shown in FIGS. 1 and 5.

Figure 6:
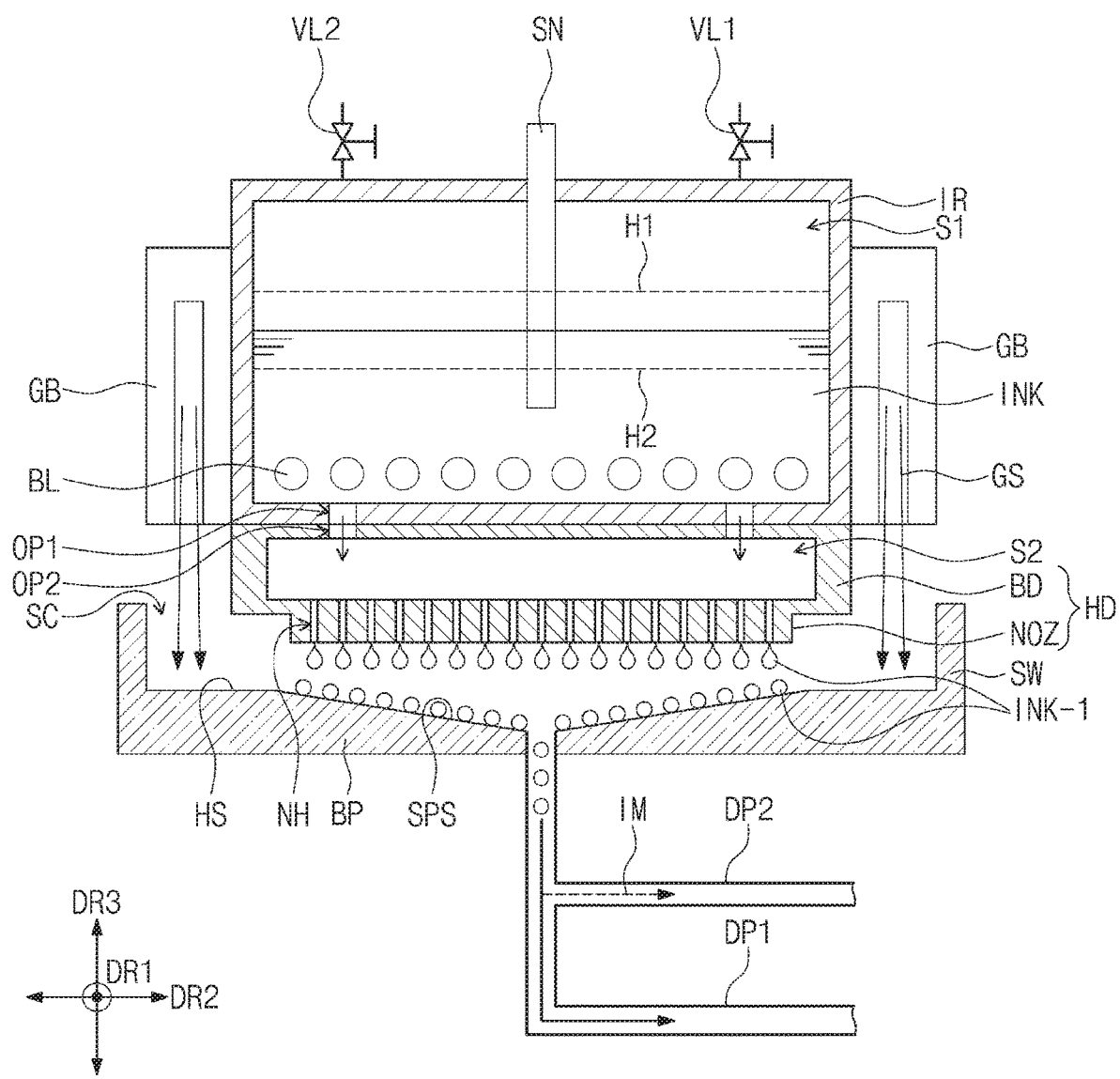
FIGS. 6 to 9 are views for explaining an operation of the ink purging portion shown in FIGS. 1 and 5.

For example, the cross-section in FIG. 6 may be viewed from a position along a line extending in the first direction DR1. In addition, for convenience of description, a portion of the nozzle NOZ in which three nozzle holes NH1, NH2, and NH3 are defined is exemplarily illustrated in FIGS. 7 to 9.

Referring to FIG. 6, the ink storage portion IR, the head portion HD, and the gas discharging portions GB may be placed on the ink purging portion PG according to movements of the first, second, and third moving portions MOV1, MOV2, and MOV3. When viewed from a plane, the ink storage portion IR, the head portion HD, and the gas discharging portions GB may overlap the bottom part BP of the ink purging portion PG. An expression of "when viewed from a plane" may represent a case when viewed from a position along a line extending in the third direction DR3, i.e., a state in which the ink purging portion PG is viewed from above the ink storage portion IR.

The nozzle NOZ may be disposed in a space SC defined by the bottom part BP and the partition wall part SW. The nozzle NOZ may be spaced apart from the bottom part BP of the ink purging portion PG to avoid a damage that may occur if the nozzle NOZ physically contacts the bottom part BP.

Figure 7:
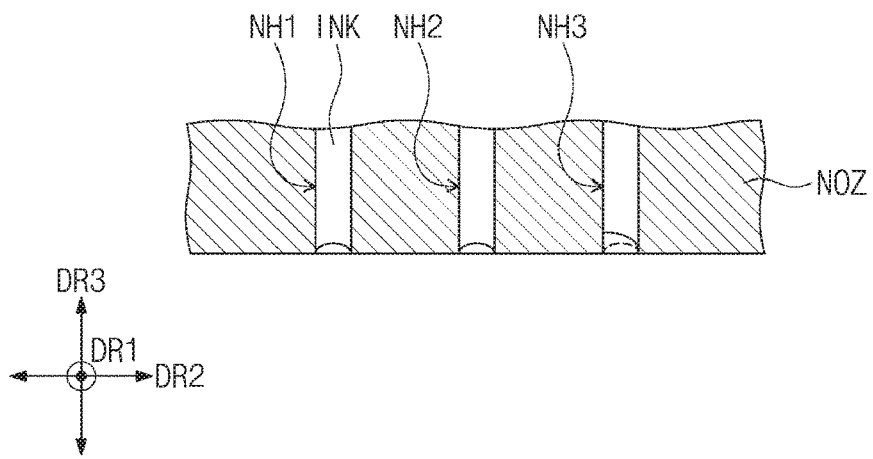

Referring to FIG. 7, the ink INK may be controllably ejected to the pixel openings PX-OP of the substrate SUB through the nozzle NOZ. For example, the ink INK is supplied to the pixel openings PX_OP in a row, and then the ink INK is supplied to the pixel openings PX_OP in the next row according to the movements of the first, second, and third moving portions MOV1, MOV2, and MOV3.

A state of the ink INK disposed in the first, second, third nozzle holes NH1, NH2, and NH3 of the nozzle NOZ may be different due to repeated injection processes. Specifically, the ink INK may not be ejected through the first, second, and third nozzle holes NH1, NH2, and NH3 when the negative pressure is provided through the second valve VL2.

Referring to FIG. 7, the shape the ink INK disposed at each of lower ends of the first and second nozzle holes NH1 and NH2 may have the same recessed shape, which is considered to be in a normal state. However, the ink INK disposed at a lower end of the third nozzle hole NH3 may have a different shape from the recessed shape of the ink INK disposed at each of the lower ends of the first and second nozzle holes NH1 and NH2. The shape of the ink INK disposed at the lower end of the third nozzle hole NH3 may considered to be in an error state.

When a process of ejecting the ink INK is performed, amounts of the ink INK discharged through the first and second nozzle holes NH1 and NH2 may be equal to each other, but they may be different from an amount of the ink INK ejected through the third nozzle hole NH3. In this case, the organic light emitting layers OEL formed by the first and second nozzle holes NH1 and NH2 and the third nozzle hole NH3 may have different shapes due to the differences of their states, i.e., normal and error states.

Figure 8:
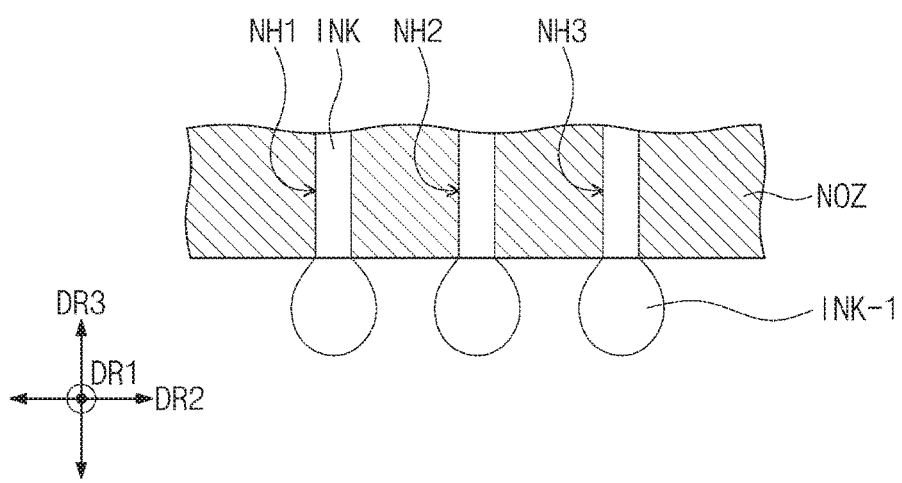

Referring to FIG. 8, in order to make a uniform state of the ink INK disposed in each of the first, second, and third nozzle holes NH1, NH2, and NH3, the head portion HD may be placed on the ink purging portion PG, and then, a predetermined amount of ink INK-1 may be ejected from the nozzle NOZ onto the ink purging portion PG. The predetermined amount of ink INK-1 ejected from each of the first, second, and third nozzle holes NH1, NH2, and NH3 may be greater than an amount of the ink INK ejected toward the pixel opening PX OP for forming the organic light emitting layer OEL.

Figure 9:
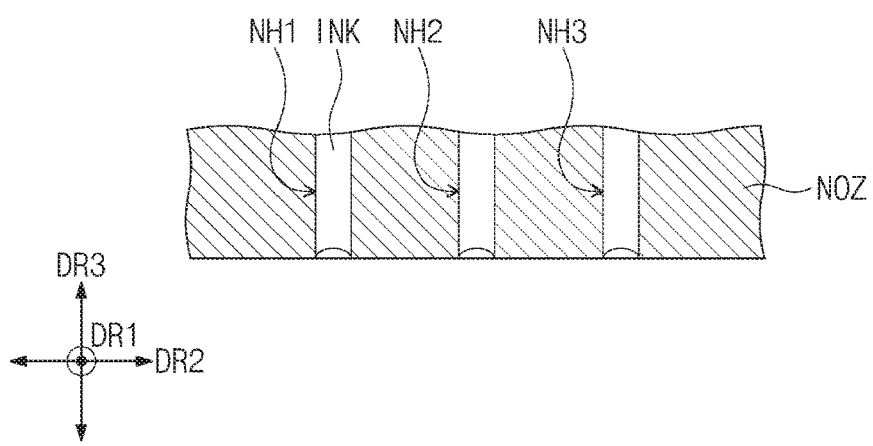

Referring to FIG. 9, as the predetermined amount of ink INK-1 is ejected from the nozzle NOZ, the ink INK disposed on the lower ends of the first, second, and third nozzle holes NH1, NH2, and NH3 may have the same recessed shape. That is, the states of the ink INK disposed in the first, second, and third nozzle holes NH1, NH2, and NH3 are initialized to the normal state as shown in FIG. 9.

Referring to FIG. 6, the predetermined amount of ink INK-1 ejected from the nozzle NOZ onto the ink purging portion PG may be removed by the ink purging portion PG. Specifically, the ink INK-1 may be provided on the bottom part BP of the ink purging portion PG, and flow toward the discharge hole EOP over the inclined surface SPS by gravity.

Referring to FIG. 6, the gas discharging portions GB may discharge a gas GS toward the bottom part BP of the ink purging portion PG. The ink INK-1 may flow more easily toward the discharge hole EOP by a purging pressure of the gas GS.

The ink INK-1 may be discharged through the discharge hole EOP. The ink INK-1 may be discharged to the outside through the first discharge pipe DP1 connected to the discharge hole EOP. Ink mist IM may be generated from the ink INK-1. The ink mist IM that is lighter than the ink INK-1 may be discharged to the outside through the second discharge pipe DP2.

If the ink INK-1 provided on the ink purging portion PG remains in the ink purging portion PG instead of being removed, the ink mist IM generated from the ink INK-1 may pollute a processing space. For example, the inkjet printing apparatus IPA may be disposed in a processing chamber, and the ink mist IM may remain in a space in the processing chamber. The remaining ink mist IM may be adsorbed to the organic light emitting layer OEL that is provided in the pixel opening PX OP, and it may cause a defect of the organic light emitting layer OEL.

However, in an embodiment of the inventive concept, the ink INK-1 may be more easily discharged through the discharge hole EOP by the gas GS discharged from the gas discharging portions GB. In addition, the ink mist IM may be discharged through the second discharge pipe DP2. Accordingly, as the ink mist IM that may be generated in the ink purging portion PG may be removed from the chamber, the defect of the organic light emitting layer OEL that may be caused by the ink mist IM may decrease.

Consequently, the inkjet printing apparatus IPA according to an embodiment of the inventive concept may decrease a defect rate of the organic light emitting layer OEL by removing the pollutant particles existing in the ink INK and the ink mist IM that may be generated in the ink purging portion PG.

Figure 10:
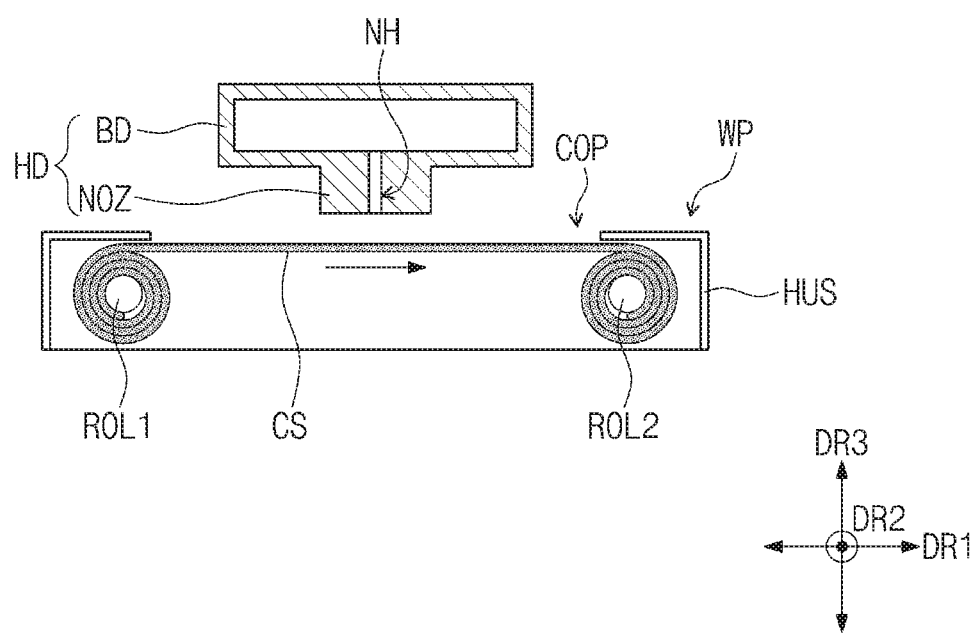
FIG. 10 is a view exemplarily illustrating a cross-section of a nozzle wiping portion shown in FIG. 1.

FIG. 10 is a view exemplarily illustrating a cross-section of the nozzle wiping portion WP shown in FIG. 1.

The cross-section that is exemplarily illustrated in FIG. 10 may be viewed from a position along a line extending the second direction DR2. In addition, for convenience of description, a cross-section of the head portion HD is also illustrated in FIG. 10.

Referring to FIG. 10, the nozzle wiping portion WP may include a housing HUS, first and second rollers ROL1 and ROL2, and a clean sheet CS. The first and second rollers ROL1 and ROL2 and the clean sheet CS may be accommodated in the housing HUS.

The first roller ROL1 and the second roller ROL2 may be spaced apart from each other in the first direction DR1. Each of the first roller ROL1 and the second roller ROL2 may rotate with respect to a rotational shaft in parallel to the second direction DR2. The first roller ROL1 and the second roller ROL2 may rotate in the same direction.

The clean sheet CS may be wound around the first roller ROL1 and the second roller ROL2. The clean sheet CS may extend from the first roller ROL1 to the second roller ROL2. A sheet opening COP for exposing the clean sheet CS between the first roller ROL1 and the second roller ROL2 may be defined in the housing HUS.

The head portion HD may be placed on the nozzle wiping portion WP according to the movements of the first, second, and third movement portions MOV1, MOV2, and MOV3. As the nozzle NOZ moves downward, the bottom surface of the nozzle NOZ may contact the clean sheet CS through the sheet opening COP.

As the first and second rollers ROL1 and ROL2 rotate, the clean sheet CS may move from the first roller ROL1 to the second roller ROL2. The clean sheet CS may clean the bottom surface of the nozzle NOZ while moving. Thus, the ink INK that may remain on the bottom surface of the nozzle NOZ may be wiped and removed.

The inkjet printing apparatus described above according to the embodiment of the inventive concept may decrease a defect rate of the organic light emitting layer by removing pollutant particles that may exist in the ink and the ink mist that may generated in the ink purging portion PG.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An inkjet printing apparatus comprising:
   a first stage on which a substrate is disposed;
   an ink storage portion comprising an ink and a plurality of adsorbents dispersed in the ink;
   a head portion comprising a nozzle configured to eject the ink supplied from the ink storage portion to the substrate;
   a gas discharging portion disposed on a side of the ink storage portion; and
   an ink purging portion that is spaced apart from the first stage in a direction horizontal to a plane of the substrate,
   wherein the ink purging portion comprises:
      a bottom part in which a discharge hole is defined; and
      a partition wall part extending upward from an edge of the bottom part.

2. The inkjet printing apparatus of claim 1, wherein each of the plurality of adsorbents comprises a zeolite.

3. The inkjet printing apparatus of claim 2, wherein the plurality of adsorbents comprises:
   a plurality of first adsorbents including pores having a diameter of about 3 Å to about 4 Å;
   a plurality of second adsorbents including pores having a diameter of about 5 Å; and
   a plurality of third adsorbents including pores having a diameter of about 8 Å to about 10 Å.

4. The inkjet printing apparatus of claim 1, wherein the ink is supplied to the head portion through a plurality of first openings defined in a lower portion of the ink storage portion.

5. The inkjet printing apparatus of claim 4, wherein each of the plurality of adsorbents has a diameter greater than that of each of the plurality of first openings.

6. The inkjet printing apparatus of claim 4, wherein an upper portion of the head portion includes a plurality of second openings overlapping the first openings, and the ink stored in the ink storage portion is supplied to the head portion through the first and second openings.

7. The inkjet printing apparatus of claim 6, wherein the ink supplied to the head portion through the first and second openings is stored in a storage space in the head portion and ejected through the nozzle.

8. The inkjet printing apparatus of claim 1, further comprising:
   a sensor part configured to measure a height of the ink stored in the ink storage portion;
   a first valve connected to the ink storage portion and configured to supply the ink to the ink storage portion according to the height of the ink; and
   a second valve connected to the ink storage portion and configured to provide a negative pressure to the ink storage portion.

9. The inkjet printing apparatus of claim 8, wherein when the height of the ink is lower than a first height, the first valve is opened, and the ink is supplied to the ink storage portion, and when the height of the ink is a second height that is greater than the first height, the first valve is closed.

10. The inkjet printing apparatus of claim 8, wherein the second valve is opened to stop the ejection of the ink, and the negative pressure is provided to the ink storage portion through the second valve.

11. The inkjet printing apparatus of claim 1,
    wherein when the head portion is placed on the ink purging portion, the ink purging portion removes a predetermined amount of ink ejected from the nozzle.

12. The inkjet printing apparatus of claim 11, wherein when the head portion is placed on the ink purging portion, the gas discharging portion discharges a gas in a downward direction toward the ink purging portion.

13. The inkjet printing apparatus of claim 11, wherein when viewed from a plane, the ink storage portion, the head portion, and the gas discharging portion overlap the bottom part, and
    the nozzle is placed in a space defined by the bottom part and the partition wall part when the head portion is placed on the ink purging portion.

14. The inkjet printing apparatus of claim 11, wherein the bottom part comprises:
    an inclined surface connected to an end of the discharge hole; and
    a horizontal surface disposed between the inclined surface and the edge of the bottom part,
    wherein the inclined surface has a height that gradually increases from the discharge hole to the horizontal surface.

15. The inkjet printing apparatus of claim 11, further comprising:
    a first discharge pipe connected to the discharge hole to discharge the predetermined amount of ink; and
    a second discharge pipe connected to the discharge hole to discharge ink mist generated from the predetermined amount of ink.

16. The inkjet printing apparatus of claim 15, wherein the second discharge pipe is disposed higher than the first discharge pipe.

17. The inkjet printing apparatus of claim 1, further comprising a nozzle wiping portion spaced apart from the ink purging portion to wipe a bottom surface of the nozzle.

18. The inkjet printing apparatus of claim 17, wherein the nozzle wiping portion comprises:
    a first roller;
    a second roller spaced apart from the first roller; and
    a clean sheet wound around the first and second rollers to move from the first roller to the second roller according to rotation of the first and second rollers,
    wherein the bottom surface of the nozzle contacts the clean sheet.

19. An inkjet printing apparatus comprising:
    a first stage on which a substrate is disposed;
    an ink storage portion comprising an ink and a plurality of adsorbents configured to adsorb pollutant particles dispersed in the ink;

a head portion comprising a nozzle configured to eject the ink supplied from the ink storage portion to the substrate;

an ink purging portion that is spaced apart from the first stage in a direction horizontal to a plane of the substrate; and a gas discharging portion configured to discharge a gas, wherein when the head portion is placed on the ink purging portion, the gas discharging portion discharges a gas toward the ink purging portion, and the ink purging portion removes a predetermined amount of ink discharged from the nozzle, and wherein the ink purging portion comprises:
   a bottom part in which a discharge hole is defined; and
   a partition wall part extending upward from an edge of the bottom part.

\* \* \* \* \*